United States Patent
Bleeker

(10) Patent No.: US 6,362,871 B1
(45) Date of Patent: *Mar. 26, 2002

(54) LITHOGRAPHIC APPARATUS

(75) Inventor: Arno Jan Bleeker, Eindhoven (NL)

(73) Assignee: ASM Lithography, B.V., Veldhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/340,710

(22) Filed: Jun. 29, 1999

(30) Foreign Application Priority Data

Jul. 1, 1998 (EP) .............................. 98202190

(51) Int. Cl.[7] .......................... G03B 27/72; G03B 27/54
(52) U.S. Cl. .......................................... 355/69; 355/67
(58) Field of Search ................. 355/53, 67–71, 355/77; 250/492.2, 492.22; 430/5, 20, 32

(56) References Cited

U.S. PATENT DOCUMENTS

| 5,255,051 A | * | 10/1993 | Allen ........................... 355/77 |
| 5,437,946 A | | 8/1995 | McCoy .......................... 430/5 |
| 5,608,492 A | * | 3/1997 | Sato ............................. 355/68 |
| 5,719,617 A | | 2/1998 | Takahashi et al. ........... 347/241 |
| 5,777,724 A | * | 7/1998 | Suzuki ......................... 355/68 |
| 5,986,742 A | * | 11/1999 | Straaijer et al. ............... 355/53 |

FOREIGN PATENT DOCUMENTS

WO    WO 93/00614    1/1993

* cited by examiner

Primary Examiner—Russell Adams
Assistant Examiner—Henry Hung Nguyen
(74) Attorney, Agent, or Firm—Pillsbury Winthrop LLP

(57) ABSTRACT

A lithographic apparatus exposes a radiation sensitive layer on a substrate to the pattern on a mask including pattern areas and opaque support. The apparatus uses a beam having a trapezoidal profile to provide a more uniform exposure at sub-field stitches in the event of any positional inaccuracies. The trapezoidal beam profile is generated by changing a characteristic, such as size or position, of the illumination beam on the mask during an exposure period.

27 Claims, 3 Drawing Sheets

LITHOGRAPHIC APPARATUS

BACKGROUND OF THE INVENTION

1. Field of the Invention

The present invention relates to a lithographic system, and more particularly to a manner of control of the illumination system in a lithographic apparatus.

2. Description of Related Art

For the sake of simplicity, the projection system may hereinafter be referred to as the "lens"; however, this term should be broadly interpreted as encompassing various types of projection systems, including refractive optics, reflective optics, catadioptric systems, and charged particle optics, for example. The illumination system may also include elements operating according to any of these principles for directing, shaping or controlling the projection beam of radiation, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatuses are described in International Patent Applications WO 98/28665 and WO 98/40791, for example.

Lithographic projection apparatuses can be used, for example, in the manufacture of integrated circuits (ICs). In such a case, the mask (reticle) may contain a circuit pattern corresponding to an individual layer of the IC, and this pattern can be imaged onto a target area (die) on a substrate (silicon wafer) which has been coated with a layer of photosensitive material (resist). In general, a single wafer will contain a whole network of adjacent dies which are successively irradiated via the reticle, one at a time. In one type of lithographic projection apparatus, each die is irradiated by exposing the entire reticle pattern onto the die in one go; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed v at which the wafer table is scanned will be a factor M times that at which the reticle table is scanned. More information with regard to lithographic devices as here described can be gleaned from International Patent Application WO 97/33205.

In a lithographic apparatus, the size of features that can be imaged onto the wafer is limited by the wavelength of the projection radiation. To produce integrated circuits with a higher density of devices and hence higher operating speeds, it is desirable to be able to image smaller features. While most current lithographic projection apparatuses employ ultraviolet light generated by mercury lamps or excimer lasers, it has been proposed to use higher frequency (energy) radiation, e.g. EUV or X-rays, or particle beams, e.g. electrons or ions, as the illumination radiation in lithographic apparatuses.

However, the glass or quartz plates on which a conventional reticle pattern is defined are generally not transparent to some of these forms of illumination radiation. As an alternative in the case of charged-particle lithography, for example, the reticle is formed of a material, e.g. metal, that is opaque to the form of radiation used and in which apertures are cut to define the reticle pattern. To avoid the need to provide obscuring support arms to opaque islands in the pattern, the reticle pattern is divided into a plurality of sub-patterns separated by supporting struts. The complete pattern is correctly imaged on the wafer by introducing successive shifts in the illumination beam after it has passed through each sub-pattern. This type of arrangement is sometimes referred to as a "strutted mask" and an example is disclosed in U.S. Pat. No. 5,079,112.

General information with regard to the use of electron beams in lithography can be gleaned, for example, from U.S. Pat. No. 5,260,151.

As disclosed in EIPBN, May 1998 AE6, "Critical dimension control at stitched sub-field boundaries in a high-throughput SCALPEL system", if the beam intensity profile of the illumination radiation is rectangular, then any positional inaccuracy in the stitching process will result in a substantial dose error. Such a stitching procedure using rectangular beam profiles is sometimes referred to as "simply-butted" and if the beam positions are not accurate there will be a region of no dose or double dose along the stitch seams. The EIPBN article therefore proposes the use of a trapezoidal beam profile and deliberate overlap in the stitching process. Positional inaccuracies then result in smaller dose errors.

The EIPBN article does not, however, disclose any method for generating an illumination beam having the desired trapezoidal intensity profile.

SUMMARY OF THE INVENTION

An object of the present invention is to provide a convenient means of generating an illumination beam having a trapezoidal intensity profile in a lithographic projection apparatus.

According to the present invention there is provided a lithographic projection apparatus for imaging of a mask pattern in a mask onto a substrate provided with a radiation sensitive layer, the mask having a plurality of transmissive regions bounded by opaque regions. The lithographic projection apparatus comprises: a radiation system comprising a radiation source and an illumination system for generating an illumination beam; a first movable object table provided with a mask holder for holding a mask; a second movable object table provided with a substrate holder for holding a substrate; and a projection system for imaging irradiated portions of the mask onto target portions of the substrate. The illumination system changes the size or position of the illumination beam on the mask during the course of an exposure period of at least part of a given transmissive region so as to generate an effective trapezoidal beam profile.

The term "transmissive region" is intended to refer to a region of the mask which is at least substantially transparent to the illumination radiation used.

With the present invention it is possible to easily generate the desired beam profile using electronic control of the beam size or position.

According to a yet further aspect of the invention there is provided a method of manufacturing a device using a lithographic projection apparatus comprising a radiation system comprising a radiation source and an illumination system for generating an illumination beam; a first movable object table provided with a mask holder for holding a mask;

a second movable object table provided with a substrate holder for holding a projection system for imaging irradiated portions of the mask onto target portions of the substrate provided with a radiation-sensitive layer, so as to partially overlap. The size or position of the illumination beam on the mask is changed during the course of an exposure period of at least part of a given transmissive region so as to generate an effective trapezoidal beam profile.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "masks, "substrate" and "target area", respectively.

In the present document, the terms illumination radiation and illumination beam are used to encompass all types of electromagnetic radiation or particle flux, including, but not limited to, ultraviolet radiation, EUV, X-rays, electrons and ions.

BRIEF DESCRIPTION OF THE DRAWINGS

The present invention will be described below with reference to exemplary embodiments and the accompanying schematic drawings, in which.

In the drawings, like reference numerals indicate like parts.

DETAILED DESCRIPTION OF THE PREFERRED EMBODIMENTS

Embodiment 1

Figure 1:
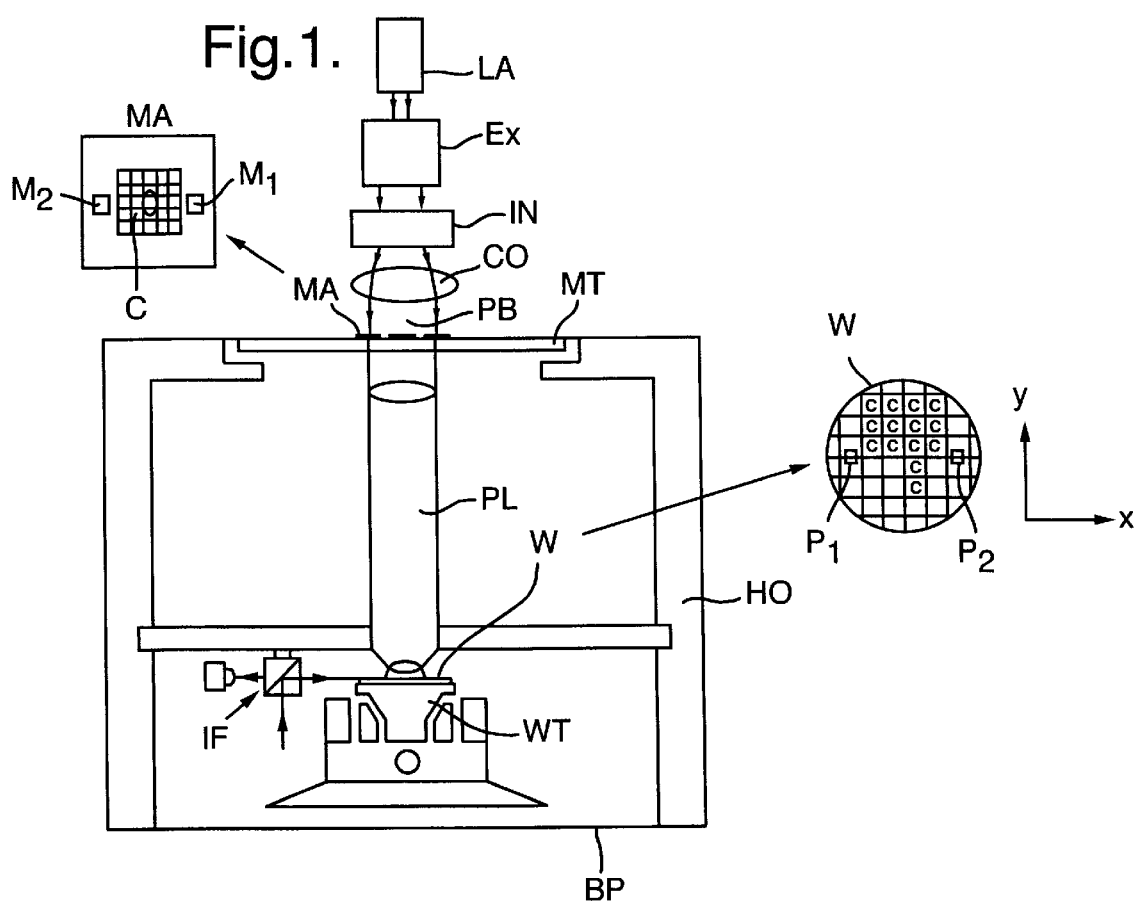
FIG. 1 depicts a lithographic projection apparatus according to a first embodiment of the invention.

FIG. 1 schematically depicts a lithographic projection apparatus according to the invention. The apparatus comprises a radiation system LA, Ex, IN, CO for supplying a projection beam PB of radiation (e.g. UV or EUV radiation); a first object table (mask table) MT provided with a mask holder for holding a mask MA (e.g. a reticle), and connected to first positioning device for accurately positioning the mask with respect to item PL; a second object table (substrate table) WT provided with a substrate holder for holding a substrate W (e.g. a resist-coated silicon wafer), and connected to a second positioning device for accurately positioning the substrate with respect to item PL: a projection system ("lens") PL (e.g. a refractive or catadioptric system, a mirror group or an array of field deflectors) for imaging an irradiated portion of the mask MA onto a target portion C (die) of the substrate W.

As here depicted, the apparatus is of a transmissive type (i.e. has a transmissive mask). However, in general, it may also be of a reflective type, for example.

The radiation system comprises a source LA (e.g., a Hg lamp, excimer laser, an undulator provided around the path of an electron beam in a storage ring or synchrotron, or an electron or ion beam source) which produces a beam of radiation.

This beam is passed along various optical components comprised in the illumination system,—e.g. beam shaping optics Ex, an integrator IN and a condenser CO—so that the resultant beam PB is substantially collimated and uniformly intense throughout its cross-section. The beam PB subsequently intercepts the mask MA which is held in a mask holder on a mask table MT. Having passed through the mask MA, the beam PB passes through the lens PL, which focuses the beam PB onto a target area C of the substrate W. With the aid of the interferometric displacement and measuring device IF, the substrate table WT can be moved accurately, e.g. so as to position different target areas C in the path of the beam PB. Similarly, the first positioning device can be used to accurately position mask MA with respect to the path of the beam PB, e.g. after mechanical retrieval of the mask MA from a mask library. In general, movement of the object tables MT, WT will be realized with the aid of a long stroke module (course positioning) and a short stroke module (fine positioning), which are not explicitly depicted in FIG. 1. The depicted apparatus can be used in two different modes: In step mode, the mask table MT is kept essentially stationary, and an entire mask image is projected in one go (i.e., a single "flash") onto a target area C. The substrate table WT is then shifted in the x and/or y directions so that a different target area C can be irradiated by the beam PB; In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target area C can be exposed, without having to compromise on resolution.

Figure 2:
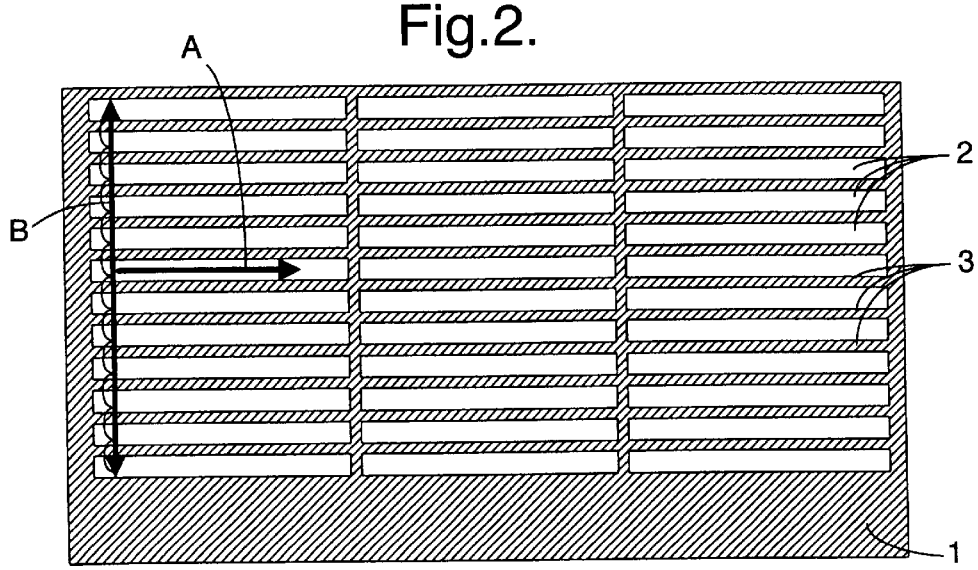
FIG. 2 is a plan view of a strutted reticle showing the scanning directions that may be used in embodiments of the invention.

FIG. 2 shows a reticle in plan and the scheme by which it can be scanned with an illumination beam. As shown, the reticle 1 comprises an array of elongate sub-fields 2 (e.g. of length 12 mm) separated by struts 3. The reticle is illuminated by, e.g., a square beam of 1×1 mm² size. The beam must illuminate each sub-field for a sufficient period to deliver a dose to expose the resist on the substrate wafer. By way of an example, if the resist sensitivity is 10 µC/cm², the beam current 10 µA and the magnification ¼ then the time required to expose each (sub-) field is 625 µs.

The scanning scheme used, which is known in the prior art, is to scan across the widths of the sub-fields in the direction of arrow B, stepping across the struts to avoid excessive heating, and to mechanically scan the wafer and reticle along the lengths of the sub-fields, in the direction of arrow A (mutually parallel or anti-parallel).

Figure 3:
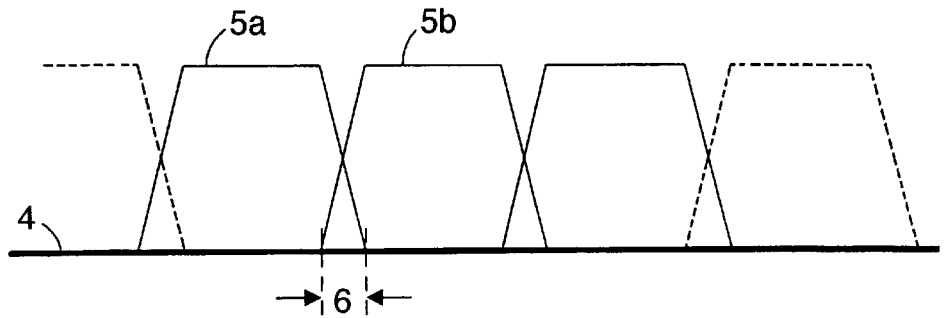
FIG. 3 illustrates the overlap between beams in a stitching process.
Figure 4:
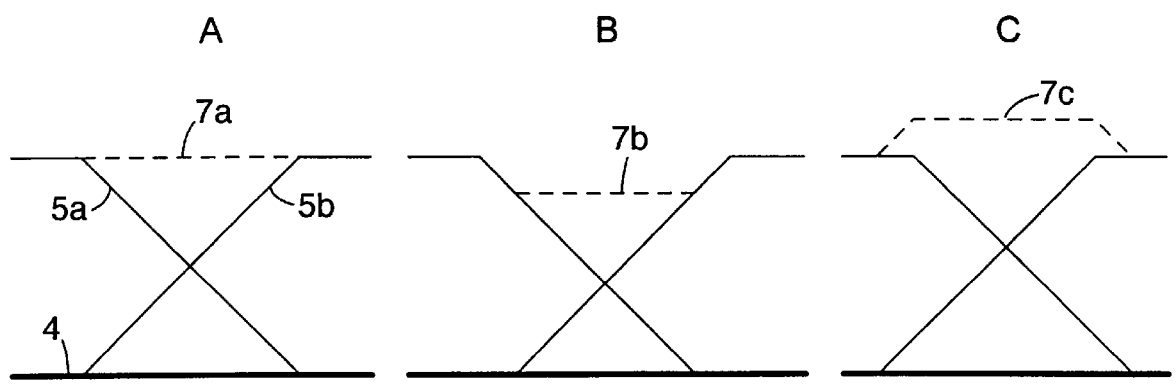
FIGS. 4A, 4B and 4C illustrate the stitching process and resultant dose in the cases of correct and incorrect beam positioning.

As shown in FIG. 3, the beams 5a and 5b used to scan adjacent sub-fields 2 have trapezoidal (intensity) profiles. In the stitching process, the beams 5a, 5b are shifted sideways so that they overlap on the wafer 4 in region 6. As shown in FIG. 4A, if the beams are correctly positioned then the net radiation dose 7a in the overlap region 6 is equal to that in the main beam portion.

The effects of small misalignments are shown in FIG. 4B and 4C. If the beams are slightly too far apart, then the net dose is slightly reduced in the overlap region, as shown by dashed line 7b. If the beams overlap too much, then the net dose is slightly increased, as shown by dashed line 7c. The slight under or over dose in either case is not as detrimental as the double dose or no dose that occurs in the event of misalignment when using a simply-butted stitching technique.

Figure 5:
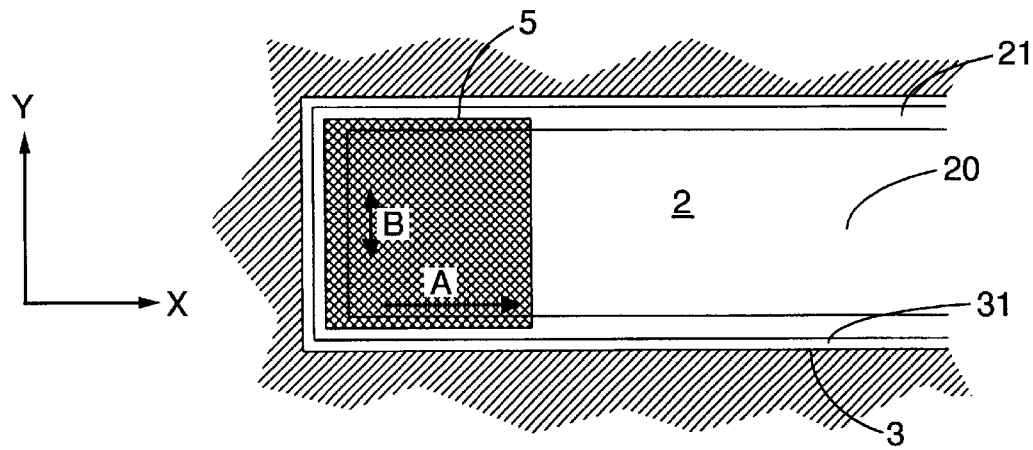
FIG. 5 is a partial view of a reticle illustrating the manner of generation of the beam profile according to a first embodiment of the invention.

FIG. 5 is a partial view of one mask sub-field and illustrates how the desired beam profile is achieved according to one embodiment of the invention.

The sub-field 2 is surrounded by the strut 3 and has around its edge a blending area 21, the pattern of which is repeated in the blending area of the adjacent sub-field. The inside edge of the strut 3 is provided with a skirt 31 which has no pattern on it.

The illumination system (not shown) projects a square illumination beam 5 of uniform-intensity illumination radiation on to the sub-field 2. The illumination beam 5 is arranged to be equal in width (in the Y-direction) to the main sub-field portion 20 plus the width of one side of the blending area 21. Thus the illumination beam is smaller than the distance between the skirts 31 of the struts 3.

The desired trapezoidal beam profile is achieved according to the invention by scanning the beam rapidly within the sub-field in the direction of arrow B. i.e. perpendicular to the length of the sub-field 2. The illumination profile shown in FIG. 3 is thus built up as the sum of a plurality of scans back and forth in direction B.

A trapezoidal profile along the longitudinal direction of the sub-field is also necessary if the beam is stepped in that direction, and this is achieved by effecting a movement in the direction of arrow A (i.e. along the length of the sub-field) that is much slower than that in the direction of arrow B.

Embodiment 2

Figure 6:
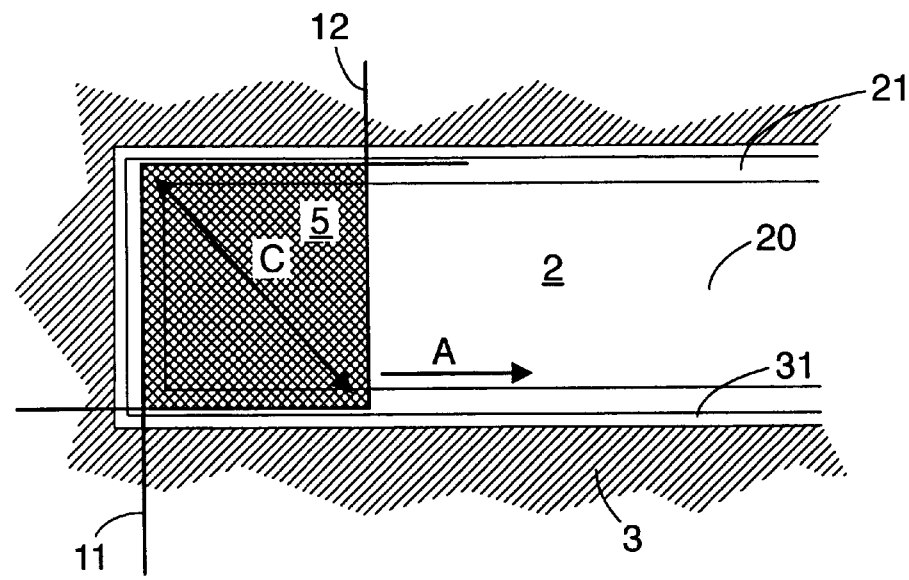
FIG. 6 is a partial view of a reticle illustrating the manner of generation of the beam profile according to a second embodiment of the invention.

FIG. 6 is a view similar to FIG. 5 but showing how the desired beam profile is achieved according to a second embodiment of the invention. In this embodiment, the shape of the illumination beam is defined by the overlap of two apertures 11, 12 in the illumination system, more precisely by the overlap of the image of one aperture on the other. The desired beam profile is obtained by shifting the image of the first aperture 11 on the second aperture 12 and by shifting the image of the second aperture on the reticle, both motions occurring along the diagonal direction C. In a preferred embodiment the illumination beam is initially set to cover only (part of) the main sub-field area 2 and is gradually enlarged to cover also (the corresponding part of) the blending area 21 during the course of the exposure. The illumination profile shown in FIG. 3 is thus built up as the sum (integration) of the illumination during the exposure period. As an alternative, the illumination beam may be initially set broadly and reduced in size during the course of the exposure.

Embodiment 3

Figure 7:
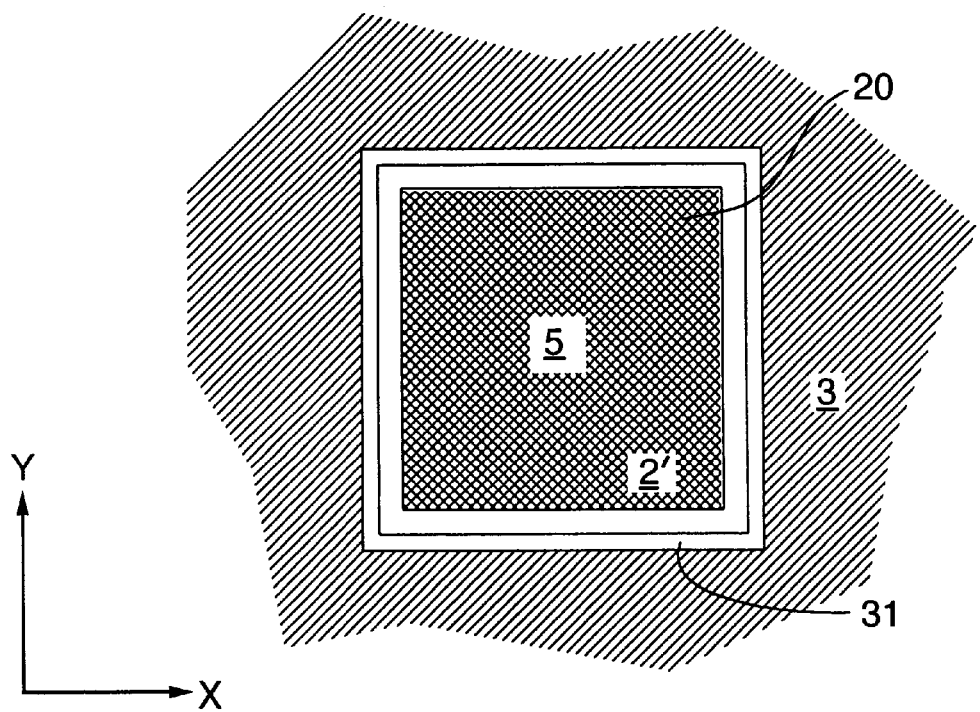
FIG. 7 is a partial view of a reticle illustrating the manner of generation of the beam profile according to a third embodiment of the invention.

A third embodiment of the invention is shown in FIG. 7 and is particularly adapted for use with square or nearly square rectangular sub-fields (e.g. with an aspect ratio of from 1:1 to 2:1) that may be flash-illuminated, e.g. in an electron beam direct-write apparatus. The square sub-field 2' is illuminated by beam 5 which remains stationary but is changed in size during the exposure to create the effective trapezoidal beam profile. At the beginning of an exposure the beam is turned on with a size matching the non-overlapped area of the sub-field and is expanded steadily in both X and Y directions during the exposure until it additionally covers the blending area 21 around the periphery of the sub-field 2'. Alternatively, the apparatus can be arranged to project a large beam initially covering the whole sub-field 2', including blending area 21, and to reduce the size of the beam during the exposure. Throughput may be improved further by exposing successive sub-fields alternately with expanding and contracting beams. This avoids the need to reset the beam shaping elements between exposures. It may further be possible to expose a square or nearly square sub-field with an orbiting movement of a beam of constant size (so that there is oscillatory motion in both the X and Y directions).

In embodiments of the invention for use in electron or ion beam lithography, for example, the beam shape may be controlled electronically by shifting the images of two shaping apertures as described in, and using the apparatus of, co-pending European Patent application no. 98201997.8 (P-0113).

While we have described above a specific embodiment of the invention it will be appreciated that the invention may be practiced otherwise than described. The description is not intended to limit the invention.

I claim:

1. A lithographic projection apparatus for imaging a mask pattern in a mask onto a substrate, comprising:
   a radiation system comprising a radiation source and an illumination system constructed and arranged to generate an illumination beam;
   a first movable object table provided with a mask holder constructed and arranged to hold a mask, the mask having a plurality of transmissive regions bounded by opaque regions;

a second movable object table provided with a substrate holder constructed and arranged to hold a substrate, said substrate having a radiation sensitive layer; and a projection system constructed and arranged to image irradiated portions of the mask onto target portions of the substrate, said illumination system being configured to change a size of the illumination beam on the mask during an exposure period of at least part of any given transmissive region to generate a time integrated intensity trapezoidal beam profile.

2. An apparatus according to claim 1, wherein said illumination system generates an illumination beam having a width less than the width of the transmissive region to be illuminated, and scans said illumination beam across said transmissive region during the exposure period.

3. An apparatus according to claim 1, wherein said illumination system scans said illumination beam across the width of said transmissive region a plurality of times during the exposure period.

4. An apparatus according to claim 1, wherein a given transmissive region comprises an overlap portion whose image will overlap on the substrate with the image of a part of an adjacent transmissive region, and a non-overlap portion whose image will not overlap with the image of an adjacent transmissive region, and said illumination system generates an illumination beam constructed and arranged to illuminate said non-overlap portion of said transmissive region at the beginning of an exposure period and to increase the size of the illumination beam to additionally illuminate at least part of said overlap portion of said transmissive region during said exposure period.

5. An apparatus according to claim 1, wherein a given transmissive region comprises an overlap portion whose image will overlap on the substrate with the image of a part of an adjacent transmissive region, and a non-overlap portion whose image will not overlap with the image of an adjacent transmissive region, and wherein said illumination system generates an illumination beam constructed and arranged to illuminate said non-overlap portion and said overlap portion of said transmissive region at the beginning of an exposure period, and to reduce, during said exposure period, the size of the illumination beam so as to illuminate said non-overlap portion of said transmissive region at the end of said exposure period.

6. An apparatus according to claim 4, wherein said transmissive region is substantially square.

7. An apparatus according to claim 5, wherein said transmissive region is substantially square.

8. An apparatus according to claim 4, wherein said transmissive region is elongated.

9. An apparatus according to claim 5, wherein said transmissive region is elongated.

10. A method of manufacturing a device using a lithographic projection apparatus comprising a radiation system comprising a radiation source and an illumination system constructed and arranged to generate an illumination beam, a first movable object table provided with a mask holder constructed and arranged to hold a mask, a second movable object table provided with a substrate holder constructed and arranged to hold a substrate, and a projection system constructed and arranged to image irradiated portions of the mask onto target portions of the substrate provided with a radiation-sensitive layer, so as to partially overlap;

said method comprising changing a size of the illumination beam on the mask during an exposure period of at least part of a given transmissive region to generate an effective trapezoidal beam profile.

11. A device manufactured by the method of claim 10.

12. A lithographic projection apparatus for imaging a mask pattern in a mask onto a substrate, comprising:

a radiation system comprising a radiation source and an illumination system constructed and arranged to generate an illumination beam;

a first movable object table provided with a mask holder constructed and arranged to hold a mask, the mask having a plurality of transmissive regions bounded by opaque regions, said transmissive regions having a longitudinal direction and a transverse direction;

a second movable object table provided with a substrate holder constructed and arranged to hold a substrate, said substrate having a radiation sensitive layer; and a projection system constructed and arranged to image irradiated portions of the mask onto target portions of the substrate, wherein said illumination system is configured to change a position of the illumination beam on the mask in both said longitudinal and said transverse directions during an exposure period of at least part of any given transmissive region to generate an effective trapezoidal beam profile.

13. An apparatus according to claim 12, wherein said illumination system includes an illumination beam having a width less than the width of the transmissive region to be illuminated, and scans said one illumination beam across the transmissive regions during the exposure period.

14. An apparatus according to claim 12, wherein said illumination system scans said illumination beam across said transverse direction of the transmissive regions a plurality of times during the exposure period.

15. An apparatus according to claim 14, wherein the transmissive regions are substantially square.

16. An apparatus according to claim 14, wherein the transmissive regions are elongated.

17. A method of imaging a mask pattern in a mask onto a substrate comprising:

illuminating said mask with an illumination beam, said mask having a plurality of transmissive regions bounded by opaque regions, said transmissive regions having a longitudinal direction and a transverse direction;

imaging at least a portion of said mask onto said substrate, wherein said illuminating includes varying over time at least one of a position mask in both said longitudinal and said transverse directions and a size of said illumination beam on said mask to produce a plurality of sub-beam illumination profiles, each sub-beam illumination profile being substantially trapezoidal.

18. A method according to claim 17, wherein the changing the position of the illumination beam comprises:

scanning the illumination beam across said transverse direction of the transmissive regions a plurality of times during the exposure period.

19. A method according to claim 17, wherein the changing the position of the illumination beam comprises:

scanning the illumination beam across said transverse direction of the transmissive regions a plurality of times during the exposure period; and scanning the illumination beam across said longitudinal direction of the transmissive regions a plurality of times during the exposure period.

20. A lithographic projection apparatus for imaging a mask pattern in a mask onto a substrate, according to claim 1, wherein said radiation source is a charged-particle source and said illumination beam is a charged-particle beam.

21. An apparatus according to claim 20, wherein said radiation source is a source of electromagnetic radiation and said illumination beam is an electromagnetic beam.

22. A method of manufacturing a device according to claim 10, wherein said radiation source is a charged-particle source and said illumination beam is a charged-particle beam.

23. A method of manufacturing a device according to claim 10, wherein said radiation source is a source of electromagnetic radiation and said illumination beam is an electromagnetic beam.

24. A lithographic projection apparatus according to claim 12, wherein said radiation source is a charged-particle source and said illumination beam is a charged particle beam.

25. A lithographic projection apparatus according to claim 12, wherein said radiation source is a source of electromagnetic radiation and said illumination beam is an electromagnetic beam.

26. A method of imaging a mask pattern in a mask onto a substrate according to claim 17, wherein said illumination beam is a charged-particle beam.

27. A method of imaging a mask pattern in a mask onto a substrate according to claim 17, wherein said illumination beam is an electromagnetic beam.

* * * * *